US012751340B2

(12) United States Patent
Kishi

(10) Patent No.: US 12,751,340 B2
(45) Date of Patent: Sep. 29, 2026

(54) SEMICONDUCTOR MODULE

(71) Applicant: FUJI ELECTRIC CO., LTD., Kawasaki (JP)

(72) Inventor: Tomoya Kishi, Matsumoto-city (JP)

(73) Assignee: FUJI ELECTRIC CO., LTD, Kawasaki (JP)

( * ) Notice: Subject to any disclaimer, the term of this patent is extended or adjusted under 35 U.S.C. 154(b) by 376 days.

(21) Appl. No.: 18/588,212

(22) Filed: Feb. 27, 2024

(65) Prior Publication Data

US 2024/0387473 A1 Nov. 21, 2024

(30) Foreign Application Priority Data

May 19, 2023 (JP) ................................ 2023-082823

(51) Int. Cl.

| | |
|---|---|
| ***H01L 25/07*** | (2006.01) |
| ***H01L 23/00*** | (2006.01) |
| ***H01L 23/498*** | (2006.01) |
| ***H10W 70/65*** | (2026.01) |
| ***H10W 90/00*** | (2026.01) |

(52) U.S. Cl.

CPC ......... *H10W 90/00* (2026.01); *H10W 70/658* (2026.01); *H10W 90/754* (2026.01)

(58) Field of Classification Search

CPC .. H10W 90/00; H10W 90/754; H10W 70/658

See application file for complete search history.

(56) References Cited

U.S. PATENT DOCUMENTS

| | | | |
|---|---|---|---|
| 2016/0351697 A1 | 12/2016 | Hartmann et al. | |
| 2020/0227345 A1 | 7/2020 | Chen et al. | |
| 2020/0395344 A1 * | 12/2020 | Horie ................... | H02M 7/003 |
| 2023/0084150 A1 | 3/2023 | Nakazawa | |

FOREIGN PATENT DOCUMENTS

| | | |
|---|---|---|
| JP | 2017-508287 A | 3/2017 |
| WO | 2019/202866 A1 | 10/2019 |
| WO | 2022/130951 A1 | 6/2022 |

OTHER PUBLICATIONS

Fuji Electric Co., Ltd., "2MBI1800XXG170-50", published in Jul. 2019, <URL:https://americas.fujielectric.com/wp-content/uploads/2019/08/2MBI1800XXG170-50.pdf>:Cited in Specification.

* cited by examiner

*Primary Examiner* — Peniel M Gumedzoe

(57) ABSTRACT

A semiconductor module includes semiconductor units arrayed in a line, a first sensing terminal disposed on a first side of the line, and a second sensing terminal disposed on a second side of the line. Each semiconductor unit includes an upper arm circuit, a lower arm circuit, and an insulating substrate including a first conductor pattern. The first sensing terminal is connected to an emitter of a first semiconductor chip included in any one semiconductor unit via a first wiring route including a first sensing conductor pattern provided on the insulating substrate. The second sensing terminal is connected to the emitter of the first semiconductor chip connected to the first sensing terminal, via a second wiring route including a second sensing conductor pattern provided on the insulating substrate separately from the first conductor pattern, without passing via the first conductor pattern.

4 Claims, 5 Drawing Sheets

SEMICONDUCTOR MODULE

CROSS REFERENCE TO RELATED APPLICATION

This application claims priority from Japanese Patent Application No. 2023-082823 filed on May 19, 2023, the entire contents of which are incorporated herein by reference.

BACKGROUND OF THE INVENTION

Field of the Invention

This disclosure relates to semiconductor modules.

Description of Related Art

A known semiconductor module includes semiconductor units, each including an insulating substrate with a semiconductor chip and a conductor pattern disposed thereon. These semiconductor units are arrayed in a line (e.g., WO 2019/202866 and WO 2022/130951). Each semiconductor unit includes an upper arm circuit having a first semiconductor chip, and a lower arm circuit having a second semiconductor chip. The semiconductor units are electrically connected in parallel to each other. Such a semiconductor module is used for a power converter or other similar devices.

An implemented module in such a semiconductor module includes a first sensing terminal electrically connected to an emitter of a first semiconductor chip included in any one of the semiconductor units, and a second sensing terminal electrically connected to a collector of a second semiconductor chip thereof. Since the emitter of the first semiconductor chip and the collector of the second semiconductor chip are electrically connected with each other, potentials of the first and second sensing terminals are equal. For example, when a switching operation of the semiconductor module is evaluated, the same evaluation can be achieved using the first sensing terminal or the second sensing terminal.

An implemented semiconductor module includes a first sensing terminal and a second sensing terminal, and both are disposed on respective sides opposing each other (e.g., Non-Patent Document of Fuji Electric Co., Ltd., "2MBI1800XXG170-50," https://americas.fujielectric.com/wp-content/uploads/2019/08/2MBI1800XXG170-50.pdf (searched on Mar. 31, 2023)).

According to this semiconductor module, the first and second sensing terminals can be properly used based on the assembly status on an apparatus.

However, such a semiconductor module, in which the first sensing terminal and the second sensing terminal are disposed across a line of the semiconductor units from each other, may cause a difference between two voltage waveforms, a voltage waveform appearing at the first sensing terminal and a voltage waveform appearing at the second sensing terminal.

SUMMARY

An object of this disclosure is to provide a semiconductor module that can suppress a difference between a voltage waveform appearing at a first sensing terminal and a voltage waveform appearing at a second sensing terminal.

A semiconductor module according to one aspect of this disclosure includes (i) a plurality of semiconductor units arrayed in a line, (ii) a first sensing terminal disposed on a first side of the line of the plurality of semiconductor units, and (iii) a second sensing terminal disposed on a second side of the line of the plurality of semiconductor units. Each of the semiconductor units includes (i) an upper arm circuit including a first semiconductor chip, (ii) a lower arm circuit including a second semiconductor chip, and (iii) an insulating substrate including a first conductor pattern through which a principal current output from the first semiconductor chip and a principal current to be input to the second semiconductor chip flow. The first sensing terminal is electrically connected to an emitter of a first semiconductor chip included in any one of the plurality of semiconductor units via a first wiring route including a first sensing conductor pattern provided on the insulating substrate. The second sensing terminal is electrically connected to the emitter of the first semiconductor chip that is connected to the first sensing terminal, via a second wiring route including a second sensing conductor pattern provided on the insulating substrate separately from the first conductor pattern, without passing via the first conductor pattern.

According to one aspect of this disclosure, it is possible to suppress the difference between the voltage waveform appearing at the first sensing terminal and the voltage waveform appearing at the second sensing terminal.

DESCRIPTION OF THE EMBODIMENT

1. Embodiment

Figure 1:
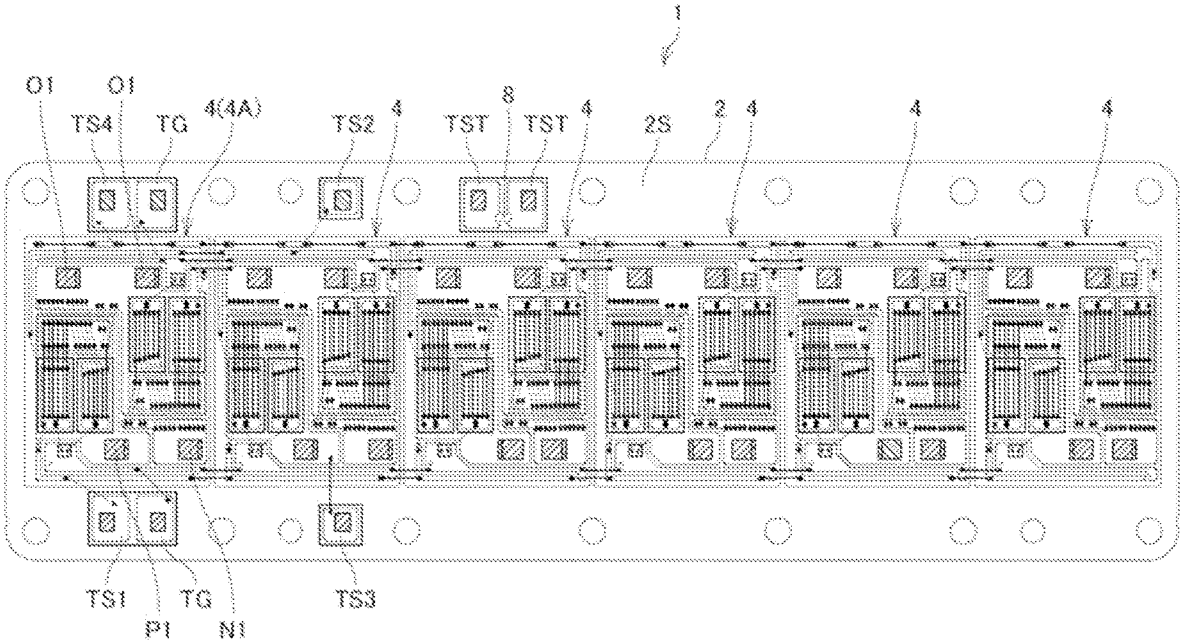
FIG. 1 is a plan view illustrating one example of a semiconductor module according to an embodiment of this disclosure.

A preferred embodiment according to this disclosure is explained below with reference to the drawings. The dimensions and scales of respective parts in the drawings may differ from those of actual products as appropriate, and illustrative parts may be included in the drawings for ease of understanding. The scope of this disclosure is not limited to the embodiment described in the following explanations unless there are descriptions particularly limiting this disclosure. The scope of this disclosure includes the scope of equivalents of the embodiments.

FIG. 1 is a plan view illustrating one example of a semiconductor module 1 according to this embodiment. The semiconductor module 1 includes a heat dissipation board 2 and semiconductor units 4. The semiconductor units 4 are arrayed in a line on a principal surface 2S of the heat dissipation board 2. A high thermal conductive material is used as a main material of the heat dissipation board 2. Examples of the material include metals, such as copper and aluminum, and alloys. The principal surface 2S of the heat dissipation board 2 may be subjected to plating processing with a metal such as nickel or an alloy to increase corrosion resistance. The heat dissipation board 2 can have any shape in plan view. In this embodiment, the heat dissipation board 2 is rectangular in plan view and is longer in the direction of arrangement of the semiconductor units 4.

Figure 2:
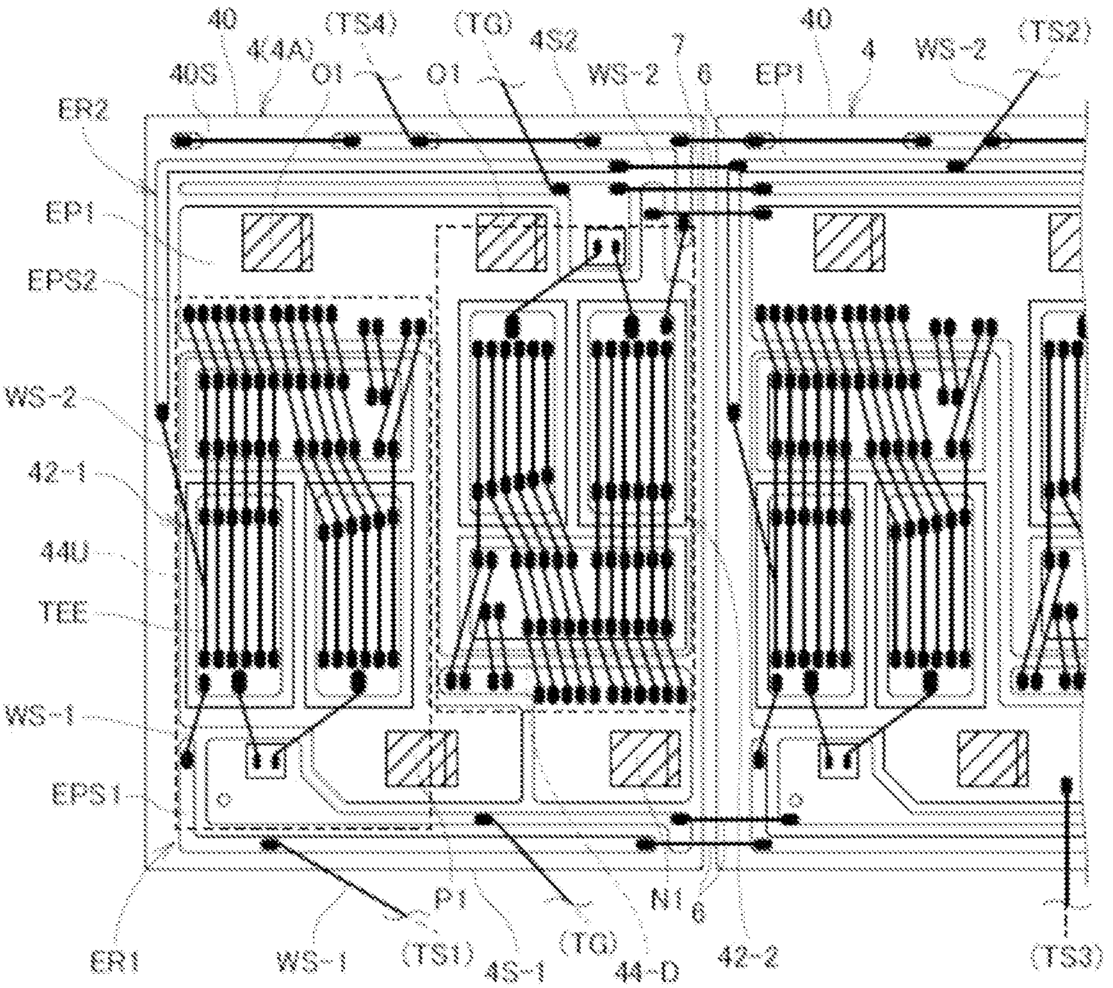
FIG. 2 is an enlarged plan view illustrating two semiconductor units on the left end in FIG. 1.

FIG. 2 is an enlarged plan view illustrating two semiconductor units 4 on the left end in FIG. 1. In this embodiment, a configuration of each semiconductor unit 4 included in the semiconductor module 1 is the same. Each semiconductor unit 4 includes an upper arm circuit 44U having a first semiconductor chip 42-1, and a lower arm circuit 44D having a second semiconductor chip 42-2. Each semiconductor unit 4 includes an insulating substrate 40, which is rectangular in plan view. The insulating substrate 40 is provided with the following (i) to (v) on a principal surface 40S thereof: (i) a positive conductive pattern including the first semiconductor chip 42-1, (ii) a first conductor pattern EP1 including the second semiconductor chip 42-2, in which the following flow on the first conductor pattern EP1: a principal current output from the first semiconductor chip 42-1, and a principal current to be input to the second semiconductor chip 42-2, (iii) a negative conductive pattern through which a principal current output from the second semiconductor chip 42-2 flows, (iv) a first sensing conductor pattern EPS1, and (v) a second sensing conductor pattern EPS2. The insulating substrate 40 is joined to the principal surface 2S of the heat dissipation board 2. A material having insulation properties and a high thermal conductivity is used as the main material of the insulating substrate 40. Examples of the material include ceramics, such as alumina.

The first semiconductor chip 42-1 and the second semiconductor chip 42-2 are switching elements, examples of which include an IGBT (Insulated Gate Bipolar Transistor) and a power MOSFET (Metal Oxide Semiconductor Field Effect Transistor). The upper arm circuit 44U and the lower arm circuit 44D are electrically connected in series and correspond to one phase of circuit elements in an inverter circuit.

Each of the following patterns: the first conductor pattern EP1, the positive conductive pattern, the negative conductive pattern, the first sensing conductor pattern EPS1, and the second sensing conductor pattern EPS2, is conductive. These patterns are made of a metal conductor, such as copper or aluminum, or an alloy, as the main material. The first conductor pattern EP1 is not directly connected to the first sensing conductor pattern EPS1 and the second sensing conductor pattern EPS2 and is connected thereto via the following: (i) an emitter electrode TEE of the first semiconductor chip 42-1, (ii) a first sensing wiring member WS-1 and (iii) a second sensing wiring member WS-2 connected to the emitter electrode TEE. The first conductor pattern EP1 is used to connect the upper arm circuit 44U and the lower arm circuit 44D in series. The first sensing conductor pattern EPS1 and the second sensing conductor pattern EPS2 will be described later.

The semiconductor module 1 of this embodiment has six semiconductor units 4, each including the upper arm circuit 44U and the lower arm circuit 44D. The semiconductor units 4 are electrically connected in parallel to each other by lines 6, lines 7 and a main-terminal connecting line (not illustrated). The semiconductor module 1 acts as a power converter that converts DC to AC power. The main-terminal connecting line is used to connect principal current terminals (a positive terminal P1, a negative terminal N1, and an output terminal O1) of each semiconductor unit 4 to one another. Members used for the lines 6 may be freely chosen and may be bonding wires. The semiconductor module 1 is used for various applications such as an inverter circuit, a DC servo circuit, and an AC servo circuit to be used in a motor driving circuit, a power supply device, or a power conditioner.

As illustrated in FIG. 1, the semiconductor module 1 of this embodiment includes four sensing terminals (including a first sensing terminal TS1, a second sensing terminal TS2, a third sensing terminal TS3, and a fourth sensing terminal TS4), two gate terminals TG, a temperature detecting terminal TST, and a thermistor 8. These are provided on the principal surface 2S of the heat dissipation board 2. The thermistor 8 is a temperature measuring element that measures a temperature of the semiconductor module 1. The temperature detecting terminal TST is connected to the thermistor 8. A temperature measured by the thermistor 8 is output to the temperature detecting terminal TST.

The first sensing terminal TS1 corresponds to a "first sensing terminal," and the second sensing terminal TS2 corresponds to a "second sensing terminal" in this disclosure. In the following explanations, a unit on the left end from among the semiconductor units 4 disposed in a line is referred to as a "specific semiconductor unit 4A."

Figure 3:
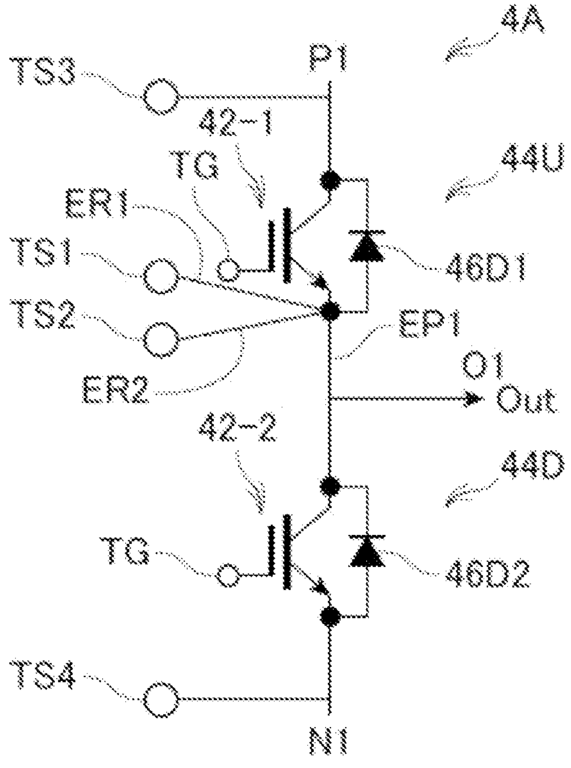
FIG. 3 is a diagram illustrating one example of an equivalent circuit of a specific semiconductor unit.

FIG. 3 is a diagram illustrating one example of an equivalent circuit of the specific semiconductor unit 4A. As explained above, the specific semiconductor unit 4A includes the upper arm circuit 44U including the first semiconductor chip 42-1, and the lower arm circuit 44D including the second semiconductor chip 42-2. The two arm circuits are connected in series by the first conductor pattern EP1. A first diode 46D1 is connected to the upper arm circuit 44U in antiparallel to the first semiconductor chip 42-1. A second diode 46D2 is connected to the lower arm circuit 44D in antiparallel to the second semiconductor chip 42-2. The specific semiconductor unit 4A is provided with a positive terminal P1, a negative terminal N1, and an output terminal O1.

The positive terminal P1 and the third sensing terminal TS3 are connected to a positive of an external DC power supply and are electrically connected to the collector of the first semiconductor chip 42-1. The negative terminal N1 and the fourth sensing terminal TS4 are connected to a negative of the DC power supply and are electrically connected to the emitter of the second semiconductor chip 42-2. The output terminal O1, the first sensing terminal TS1, and the second sensing terminal TS2 are connected to an external output end (not shown) and are electrically connected to the emitter of the first semiconductor chip 42-1 and the collector of the second semiconductor chip 42-2. The principal current terminals, which include the positive terminal P1, the negative terminal N1, and the output terminal O1, are connected in parallel to an external connection terminal for the principal current by a main-terminal connecting line (not shown). The two gate terminals TG each receive a control signal from an outside control circuit. One of the two is electrically connected to the gate of the first semiconductor chip 42-1, and the other is electrically connected to the second semiconductor chip 42-2.

When the positive terminal P1 and the negative terminal N1 receive DC power from the DC power supply, the first semiconductor chip 42-1 and the second semiconductor chip 42-2 each receive a control signal through the corresponding gate terminal TG, whereby each of the first semiconductor chip 42-1 and the second semiconductor chip 42-2 performs a switching operation. As a result, an AC current flows in the output terminal O1 on the first conductor pattern EP1 and AC power corresponding to one phase is output.

As described above, the semiconductor units 4 are connected in parallel to each other by the lines 6, the lines 7, and the main-terminal connecting line. Each of the semiconductor units 4 operates in substantially the same manner as the specific semiconductor unit 4A in accordance with the DC power or the control signal supplied to the positive terminal P1, the negative terminal N1, and the gate terminals TG.

As illustrated in FIG. 1, the semiconductor module 1 of this embodiment includes a semiconductor unit 4 adjacent to the specific semiconductor unit 4A. The third sensing terminal TS3 is connected to the collector of the first semiconductor chip 42-1 included in the adjacent semiconductor unit 4.

The first sensing terminal TS1 and the second sensing terminal TS2 are described next in detail.

As illustrated in FIG. 3, the first sensing terminal TS1 and the second sensing terminal TS2 each are connected to the emitter of the first semiconductor chip 42-1 of the specific semiconductor unit 4A and each receive a voltage of the emitter of the first semiconductor chip 42-1. Each of the first and second sensing terminals TS1 and TS2 is used for an evaluation test to evaluate the switching operation of the semiconductor module 1.

The emitter of the first semiconductor chip 42-1 is electrically connected to the collector of the second semiconductor chip 42-2. For this reason, the emitter of the first semiconductor chip 42-1 and the collector of the second semiconductor chip 42-2 basically have the same potential. Both the first and second sensing terminals TS1 and TS2 receive the voltage of the collector of the second semiconductor chip 42-2.

As illustrated in FIG. 1, when viewed in plan view of the semiconductor module 1, the semiconductor units 4 arrayed in a line are between the first and second sensing terminals TS1 and TS2. The first sensing terminal TS1 is disposed at a position across the array of the semiconductor units 4 from the second sensing terminal TS2. In other words, the line of the semiconductor units 4 has two sides opposite each other in a longitudinal direction. The first sensing terminal TS1 is disposed on one side (a first side) of the line of the semiconductor units 4. The second sensing terminal TS2 is disposed on the other side (a second side). As a result, when an evaluation test or other similar test is performed, a user can appropriately select one of the first sensing terminal TS1 and the second sensing terminal TS2, which is easier to use based on (i) the orientation of the semiconductor module 1 when assembled with another device, and (ii) the assembly state such as a space around the semiconductor module 1. This enhances convenience.

The emitter of the first semiconductor chip 42-1 and the collector of the second semiconductor chip 42-2 basically have the same potential. For this reason, even if the second sensing terminal TS2 is directly connected to the collector of the second semiconductor chip 42-2 and is not connected to the emitter of the first semiconductor chip 42-1, ideally, the same voltage appears at the first and second sensing terminals TS1 and TS2. Such a specific configuration is given in which the second sensing terminal TS2 is directly connected to the first conductor pattern EP1 for connecting the emitter of the first semiconductor chip 42-1 to the collector of the second semiconductor chip 42-2. Hereinafter, this configuration is referred to as a "comparative configuration."

Figure 4:
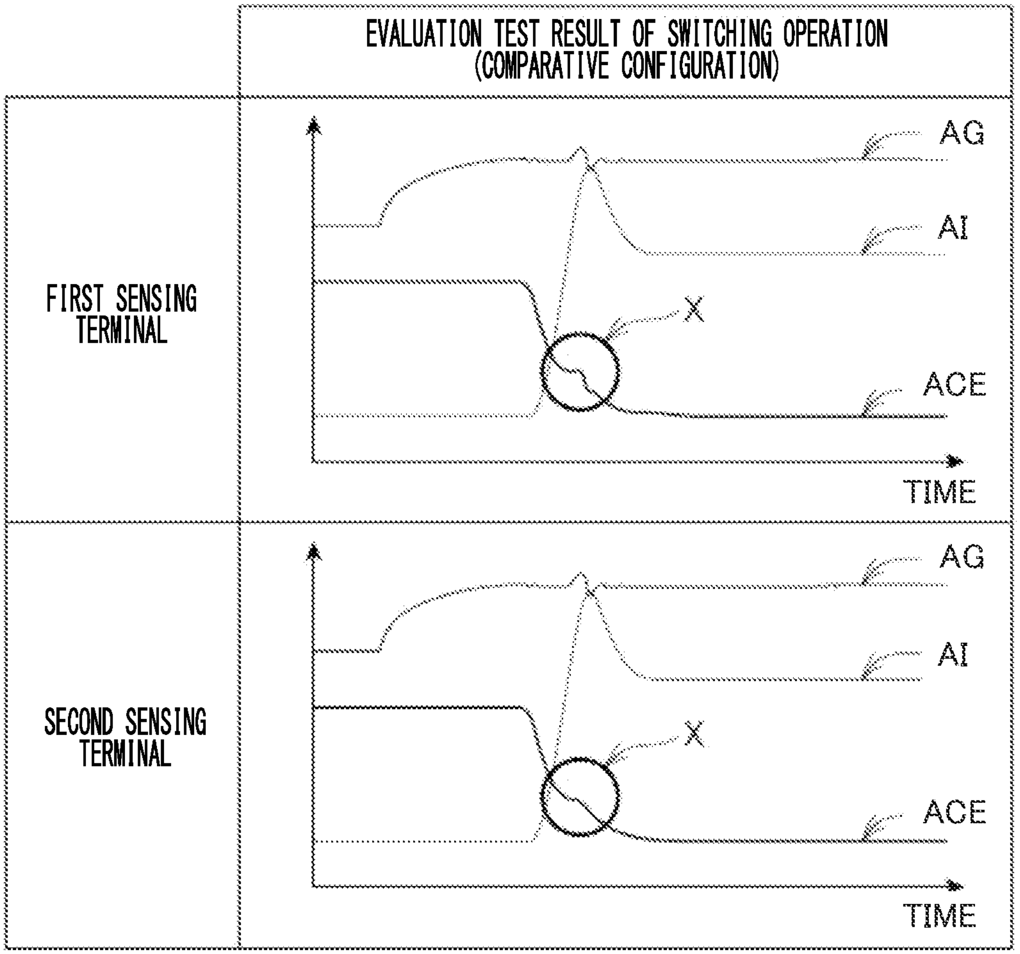
FIG. 4 is a diagram illustrating an evaluation test result of a switching operation for a comparative configuration.

FIG. 4 is a diagram illustrating an evaluation test result of a switching operation for the comparative configuration. The evaluation test was implemented as follows. The second semiconductor chip 42-2 of the lower arm circuit 44D included in each semiconductor unit 4 was turned off. In this state, a switching operation was implemented for the first semiconductor chip 42-1 of the upper arm circuit 44U included in each semiconductor unit 4. A voltage between the emitter of the first semiconductor chip 42-1 and the collector of the second semiconductor chip 42-2 was evaluated. The first sensing terminal TS1 and the second sensing terminal TS2 were used to measure this voltage. Hereinafter, the voltage between the emitter of the first semiconductor chip 42-1 and the collector of the second semiconductor chip 42-2 is referred to as an "emitter-collector voltage VEC." In FIG. 4, lines denoted by arrows AG indicate the gate voltage, lines denoted by arrows AI indicate the output current, and lines denoted by arrows ACE indicate the emitter-collector voltage. The gate voltage is applied to the gate of the first semiconductor chip 42-1 through the gate terminal TG. The output current is output from the emitter of the first semiconductor chip 42-1 to the first conductor pattern EP1.

When a waveform of the emitter-collector voltage appearing at the first sensing terminal TS1 is compared to that appearing at the second sensing terminal TS2, a noticeable difference occurs in turn-on waveforms in the switching operation indicated by arrows X in FIG. 4. Such a difference is explained as follows. First, a relatively large principal current flows in the first conductor pattern EP1. In addition, the linewidth of the first conductor pattern EP1 is greater than those of other conductor patterns on the semiconductor unit 4 to suppress heat generation in the first conductor pattern EP1. As a result, electrical characteristics (e.g., inductance) of the first conductor pattern EP differ from those in other conductor patterns. Second, the first conductor pattern EP1 is included in a wiring route leading from the second sensing terminal TS2 to the collector of the second semiconductor chip 42-2. In contrast, the first conductor pattern EP1 is not included in a wiring route leading from the first sensing terminal TS1 to the emitter of the first semiconductor chip 42-1. As a result, the voltage waveform appearing at the second sensing terminal TS2 differs from that appearing at the first sensing terminal TS1 due to effects of the principal current.

The first conductor pattern EP1 according to the semiconductor module 1 of this embodiment is included in neither a wiring route leading from the first sensing terminal TS1 to the emitter of the first semiconductor chip 42-1, nor a wiring route leading from the second sensing terminal TS2 to the emitter of the first semiconductor chip 42-1. As a result, the two voltage waveforms, the voltage waveform appearing at the first sensing terminal TS1 and that appearing at the second sensing terminal TS2, are not affected by the first conductor pattern EP, thereby suppressing the difference between the two voltage waveforms.

The wiring route from each of the first and second sensing terminals TS1 and TS2 to the emitter of the first semiconductor chip 42-1 is explained next in more detail. Hereinafter, a wiring route from the first sensing terminal TS1 to the emitter of the first semiconductor chip 42-1 is referred to as a "first wiring route ER1." A wiring route from the second sensing terminal TS2 to the emitter of the first semiconductor chip 42-1 is referred to as a "second wiring route ER2."

As illustrated in FIG. 2, the first wiring route ER1 includes the first sensing conductor pattern EPS1 provided on the insulating substrate 40, and the first sensing wiring members WS-1. The first sensing wiring members WS-1 include a first sensing wiring member WS-1 for connecting the emitter electrode TEE included in the first semiconductor chip 42-1 to the first sensing conductor pattern EPS1, and a first sensing wiring member WS-1 for connecting the first sensing conductor pattern EPS1 to the first sensing terminal TS1. The second wiring route ER2 includes the second sensing conductor pattern EPS2 provided on the insulating substrate 40, and the second sensing wiring members WS-2. The second sensing wiring members WS-2 include a second sensing wiring member WS-2 for connecting the emitter electrode TEE of the first semiconductor chip 42-1 to the second sensing conductor pattern EPS2, and a second sensing wiring member WS-2 for connecting the second sensing conductor pattern EPS2 to the second sensing terminal TS2. For example, bonding wires are used as the first sensing wiring members WS-1 and the second sensing wiring members WS-2.

Thus, the first sensing conductor pattern EPS1 is physically connected to the emitter electrode TEE included in the first semiconductor chip 42-1 by the first sensing wiring member WS-1. In addition, the second sensing conductor pattern EPS2 is physically connected to the same emitter electrode TEE by the second sensing wiring member WS-2. As compared to a configuration in which the first sensing conductor pattern EPS1 and the second sensing conductor pattern EPS2 are each connected to different positions, the difference between two voltage waveforms, the voltage waveform appearing at the first sensing terminal TS1, and the voltage waveform appearing at the second sensing terminal TS2, is further suppressed.

In the specific semiconductor unit 4A of this embodiment, the first sensing conductor pattern EPS1 is disposed adjacent to a first side 4S1 closest to the first sensing terminal TS1, and extends along the first side 4S1. The first sensing conductor pattern EPS1 is near the first sensing terminal TS1, which can shorten the wiring length of the first sensing wiring member WS-1 for connecting the first sensing conductor pattern EPS1 to the first sensing terminal TS1.

The second sensing conductor pattern EPS2 is disposed adjacent to a second side 4S2, which is the opposite side to the first side 4S1 across the array of the semiconductor units 4 (i.e., across the first semiconductor chip 42-1). The second sensing conductor pattern EPS2 extends along the second side 4S2. As a result, the second sensing conductor pattern EPS2 is also near the second sensing terminal TS2, thereby shortening the wiring length of the second sensing wiring member WS-2 for connecting the second sensing conductor pattern EPS2 to the second sensing terminal TS2.

In this embodiment, the second sensing terminal TS2 is not directly connected to the second sensing wiring member WS-2 of the specific semiconductor unit 4A but is connected to the second sensing wiring member WS-2 of the semiconductor unit 4 next to the specific semiconductor unit 4A. Specifically, the second sensing conductor pattern EPS2 of the specific semiconductor unit 4A is connected to the second sensing conductor pattern EPS2 of the semiconductor unit 4 adjacent thereto by the second sensing wiring member WS-2. The second sensing terminal TS2 is connected to the second sensing conductor pattern EPS2 of the adjacent semiconductor unit 4 by the second sensing wiring member WS-2.

The second sensing terminal TS2 is connected to the emitter electrode TEE of the first semiconductor chip 42-1 included in the specific semiconductor unit 4A via the second sensing conductor pattern EPS2 of the adjacent semiconductor unit 4. For this reason, the second sensing terminal TS2 can be disposed at any position on the principal surface 2S of the heat dissipation board 2 without being limited by the position of the specific semiconductor unit 4A. The second sensing terminal TS2 may be connected to the specific semiconductor unit 4A via the second sensing conductor patterns EPS2 of two or more other semiconductor units 4.

In this embodiment, electrical characteristics of the first wiring route ER1 are substantially equal to those of the second wiring route ER2. The electrical characteristics (e.g., inductance and resistance) have impacts on the voltage waveforms appearing at the respective first sensing terminal TS1 and the second sensing terminal TS2. To obtain such electrical characteristics, the linewidths, the thicknesses, the shapes in plan view, and the main materials of the first and second sensing conductor pattern EPS1 and EPS2 may be adjusted appropriately. Alternatively, the sectional areas, the lengths, and joining materials of the first sensing wiring members WS-1 and the second sensing wiring members WS-2 may be adjusted appropriately. The substantially equal electrical characteristics of the first wiring route ER1 and the second wiring route ER2 further suppress the difference between two voltage waveforms, the voltage waveform appearing at the first sensing terminal TS1 and the voltage waveform appearing at the second sensing terminal TS2.

As described above, the semiconductor module 1 of this embodiment includes the semiconductor units 4 arrayed in a line. Each semiconductor units 4 includes (i) the upper arm circuit 44U including the first semiconductor chip 42-1, (ii) the lower arm circuit 44D including the second semiconductor chip 42-2, and (iii) the insulating substrate 40 including the first conductor pattern EP1 through which a principal current output from the first semiconductor chip 42-1 and a principal current to be input to the second semiconductor chip 42-2 flow. The line of the semiconductor units 4 has two sides opposite each other in a longitudinal direction. The semiconductor module 1 further includes the first sensing terminal TS1 disposed on one side (a first side) of the line of the semiconductor units 4, and the second sensing terminal TS2 disposed on the other side (a second side). The first sensing terminal TS1 is connected to the emitter of the first semiconductor chip 42-1 of the specific semiconductor unit 4A via the first wiring route ER1 including the first sensing conductor pattern EPS1 provided on the insulating substrate 40. The second sensing terminal TS2 is connected to the emitter of the first semiconductor chip 42-1 that is connected to the first sensing terminal TS1, via the second wiring route ER2 including the second sensing conductor pattern EPS2 provided on the insulating substrate 40 separately from the first conductor pattern EP1, without passing via the first conductor pattern EP1.

According to this configuration, the first sensing terminal TS1 is connected to the emitter of the first semiconductor chip 42-1 via the first wiring route ER1 including the first sensing conductor pattern EPS1. Also, the second sensing terminal TS2 is connected to the emitter of the same first semiconductor chip 42-1 via the second wiring route ER2 including the second sensing conductor pattern EPS2. Thus, with equalization of the electrical characteristics of the first and second wiring routes ER1 and ER2, the difference between the two voltage waveforms, the voltage waveform appearing at the first sensing terminal TS1 and the voltage waveform appearing at the second sensing terminal TS2, is suppressed. In addition, the first and second sensing conductor patterns EPS1 and EPS2 are both provided separately from the first conductor pattern EP1. As a result, the voltage waveform appearing at the second sensing terminal TS2 is prevented from greatly differing from the voltage waveform appearing at the first sensing terminal TS1 due to influences of the principal current flowing in the first conductor pattern EP1, as compared to the comparative configuration, in which the second sensing terminal TS2 is physically connected to the first conductor pattern EP1 instead of the second sensing conductor pattern EPS2.

In the semiconductor module 1 of this embodiment, the first sensing conductor pattern EPS1 and the second sensing conductor pattern EPS2 are connected to the emitter electrode TEE included in the first semiconductor chip 42-1 by the first sensing wiring member WS-1 and the second sensing wiring member WS-2, respectively.

According to this configuration, the first and second sensing conductor patterns EPS1 and EPS2 are both physically connected to the emitter electrode TEE of the same first semiconductor chip 42-1. As a result, the difference between the two voltage waveforms, the voltage waveform appearing at the first sensing terminal TS1 and the voltage waveform appearing at the second sensing terminal TS2, is further suppressed.

In the semiconductor module 1 of this embodiment, the first semiconductor chip 42-1 connected to the first sensing terminal TS1 is disposed between the first and second sensing conductor patterns EPS1 and EPS2. That is, the first sensing conductor pattern EPS1 is disposed at a position across the first semiconductor chip 42-1 from the second sensing conductor pattern EPS2.

According to such a configuration, the following wiring lengths can be shortened: (i) a wiring length between the first sensing terminal TS1 and the first sensing conductor pattern EPS1, and (ii) a wiring length between the second sensing terminal TS2 and the second sensing conductor pattern EPS2.

2. Modification

A modification added to the foregoing embodiment is exemplified below. Two or more modifications optionally selected from the following exemplifications may be appropriately combined as long as they do not conflict.

First Modification

Figure 5:
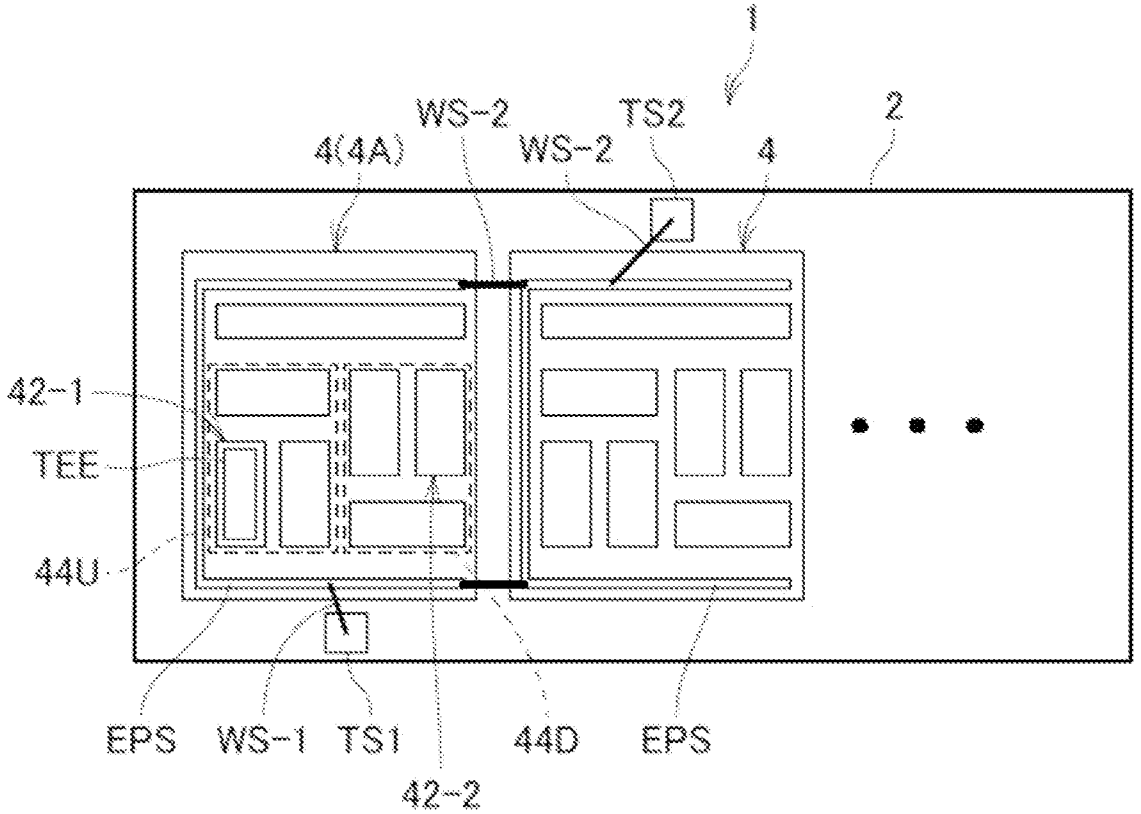
FIG. 5 is a simplified plan view illustrating one example of a planar configuration of semiconductor units according to a modification.

FIG. 5 is a simplified plan view illustrating one example of a planar configuration of semiconductor units 4 according to this modification. As illustrated in FIG. 5, the first sensing conductor pattern EPS1 and the second sensing conductor pattern EPS2 may be physically connected to each other. In other words, each semiconductor unit 4 may include a continuous pattern EPS in which the first and second sensing conductor patterns EPS1 and EPS2 are continuous. According to this modification, the first and second sensing conductor patterns EPS1 and EPS2 are continuous, thereby suppressing the difference in the electrical characteristics between the first and second sensing conductor patterns EPS1 and EPS2. As a result, the difference between the two voltage waveforms, the voltage waveform appearing at the first sensing terminal TS1 and the voltage waveform appearing at the second sensing terminal TS2, is suppressed.

The first sensing conductor pattern EPS1 may include physically separated patterns, which are electrically connected to one another by one or more wiring members. In the same manner, the second sensing conductor pattern EPS2 may include physically separated patterns, which are electrically connected to one another by one or more wiring members.

DESCRIPTION OF REFERENCE SIGNS

1 . . . semiconductor module, 2 . . . heat dissipation board, 4 . . . semiconductor unit, 4A . . . specific semiconductor unit, 40 . . . insulating substrate, 42-1 . . . first semiconductor chip, 42-2 . . . second semiconductor chip, 44D . . . lower arm circuit, 44U . . . upper arm circuit, EP1 . . . first conductor pattern, EPS1 . . . first sensing conductor pattern, EPS2 . . . second sensing conductor pattern, ER1 . . . first wiring route, ER2 . . . second wiring route, TEE . . . emitter electrode, TS1 . . . first sensing terminal, TS2 . . . second sensing terminal, WS-1 . . . first sensing wiring member, WS-2 . . . second sensing wiring member.

What is claimed is:

1. A semiconductor module comprising:
- a plurality of semiconductor units arrayed in a line;
- a first sensing terminal disposed on a first side of the line of the plurality of semiconductor units; and
- a second sensing terminal disposed on a second side of the line of the plurality of semiconductor units, wherein:
- each of the semiconductor units includes:
  - an upper arm circuit including a first semiconductor chip;
  - a lower arm circuit including a second semiconductor chip; and
  - an insulating substrate including a first conductor pattern through which a principal current output from the first semiconductor chip and a principal current to be input to the second semiconductor chip flow,
- the first sensing terminal is electrically connected to an emitter of a first semiconductor chip included in any one of the plurality of semiconductor units via a first wiring route including a first sensing conductor pattern provided on the insulating substrate, and
- the second sensing terminal is electrically connected to the emitter of the first semiconductor chip that is connected to the first sensing terminal, via a second wiring route including a second sensing conductor pattern provided on the insulating substrate separately from the first conductor pattern, without passing via the first conductor pattern.

2. The semiconductor module according to claim 1, wherein each of the first sensing conductor pattern and the second sensing conductor pattern is connected to an emitter electrode included in the first semiconductor chip by a bonding wire.

3. The semiconductor module according to claim 1, wherein the first sensing conductor pattern and the second sensing conductor pattern are continuous.

4. The semiconductor module according to claim 1, wherein the first conductor pattern is disposed between:
- the first semiconductor chip that is electrically connected to the first sensing terminal, and
- the second sensing terminal.

* * * * *